United States Patent [19]

Nguyen et al.

[11] Patent Number: 5,356,722
[45] Date of Patent: Oct. 18, 1994

[54] METHOD FOR DEPOSITING OZONE/TEOS SILICON OXIDE FILMS OF REDUCED SURFACE SENSITIVITY

[75] Inventors: Bang Nguyen, Fremont; Ellie Yieh, Millbrae; Maria Galiano, San Jose, all of Calif.

[73] Assignee: Applied Materials, Inc., Santa Clara, Calif.

[21] Appl. No.: 896,296

[22] Filed: Jun. 10, 1992

[51] Int. Cl.[5] .............................................. C23C 16/00
[52] U.S. Cl. .................................. 427/569; 427/255; 427/255.1; 427/255.2; 427/255.3; 427/255.7; 427/419.2; 427/574; 427/579
[58] Field of Search ............... 427/569, 574, 579, 255, 427/255.1, 255.2, 255.3, 255.7, 419.2

[56] References Cited

U.S. PATENT DOCUMENTS

| | | | |
|---|---|---|---|
| 4,854,263 | 8/1989 | Chang et al. | 118/715 |
| 4,872,947 | 10/1989 | Wang et al. | 156/643 |
| 4,956,312 | 9/1990 | Van Laarhoven | 437/187 |
| 5,040,046 | 8/1991 | Chhabra et al. | 427/579 |
| 5,120,680 | 6/1992 | Foo et al. | 427/99 |
| 5,210,801 | 5/1993 | Fournier et al. | 385/14 |

OTHER PUBLICATIONS

Fujino et al, J. Electrochem. Soc. vol. 138 No. 2 Feb. 1991 pp. 550–554.
Matsuura et al, Abs. 22nd Conf on Solid State Devices & Matls, 1990, pp. 187–193 no month available.
Fujino et al, Jun. 12–13, 1990 VMIC Conf. IEEE pp. 187–193.

*Primary Examiner*—Shrive P. Beck
*Assistant Examiner*—David M. Maiorana
*Attorney, Agent, or Firm*—Birgit E. Morris

[57] ABSTRACT

A process for depositing void-free silicon oxide layers over stepped topography comprising depositing a first silicon oxide seed layer which is doped with nitrogen from a plasma of tetraethoxysilane and a nitrogen-containing gas, and depositing thereover a silicon oxide layer from a mixture of tetraethoxysilane, ozone and oxygen at low temperatures to produce a silicon oxide layer having improved properties.

6 Claims, 2 Drawing Sheets

METHOD FOR DEPOSITING OZONE/TEOS SILICON OXIDE FILMS OF REDUCED SURFACE SENSITIVITY

This invention relates to an improved method of depositing silicon oxide. More particularly, this invention relates to an improved method of depositing silicon oxide layers on a substrate by thermal decomposition of tetraethoxysilane and ozone.

BACKGROUND OF THE INVENTION

In the manufacture of VLSI semiconductor devices, multilevel interconnects are made to increase the packing density of devices on a wafer. This also requires multilevel dielectric layers to be deposited between conductive layers. Such dielectric layers must have good step coverage and planarization properties to produce void-free layers that not only completely fill steps and openings in the underlying substrate, but also form smooth, planarized dielectric layers. Further, such dielectric layers must be able to be deposited at low temperatures, preferably below about 400° C., to avoid damage to underlying, already formed interconnects.

It is known that silicon oxide dielectric layers can be deposited with good conformality and planarization using tetraethoxysilane (hereinafter TEOS), ozone and oxygen at comparatively low temperatures, e.g., about 375° C. It is also known that the ratio of TEOS and ozone affects the film quality and deposition rate. For example, when depositing silicon oxide from TEOS and ozone using a high ozone:TEOS flow ratio, the rate of deposition is reduced, but the film quality is higher and conformality, i.e., the ability to produce void-free filling and planarized layers, is also higher. The layers provide good step coverage and good conformality which leads to excellent planarization, and excellent quality of the silicon oxide when deposited onto silicon. However, when the silicon oxide is deposited onto silicon oxide, for example a thermally grown silicon oxide layer, differences in film quality have arisen. The deposition rate of low temperature silicon oxide films from TEOS and ozone deposited onto thermal silicon oxide is about 20% lower, and the wet etch rate of silicon oxide is high, which is indicative of poor quality films. Furthermore, the surface of the silicon oxide is very rough and contains voids, indicative of a porous film.

Fujino et al have addressed this problem. Their solution is a two step deposition process; first a deposit of silicon oxide using a low ozone concentration (0.5%) is put down, and a second layer deposited thereover using a high ozone concentration (5%). The result is said to be improved film quality of silicon oxide planarizing films.

However, this ozone-TEOS process still has limitations in terms of poor surface quality and surface sensitivity. The higher the ozone:TEOS ratio, the greater the decrease in oxide deposition rate, and the greater the degradation in film properties, such as wet etch rate, water resistance and stress drift with time.

Thus an improved process for depositing silicon oxide layers from TEOS and ozone having excellent conformality and film quality is desirable, particularly for the manufacture of VLSI devices.

SUMMARY OF THE INVENTION

A method of depositing silicon oxide from TEOS and ozone which comprises depositing a first seed layer of a nitrogen-doped PECVD TEOS silicon oxide and depositing a second layer of silicon oxide thereover in a non-plasma, thermal process using high pressure, high ozone:TEOS flow ratios. The resultant silicon oxide layers have reduced surface sensitivity and excellent film qualities, and improved conformality of silicon oxide films which can produce void-free films over submicron sized topography.

DETAILED DESCRIPTION OF THE INVENTION

Figure 1:
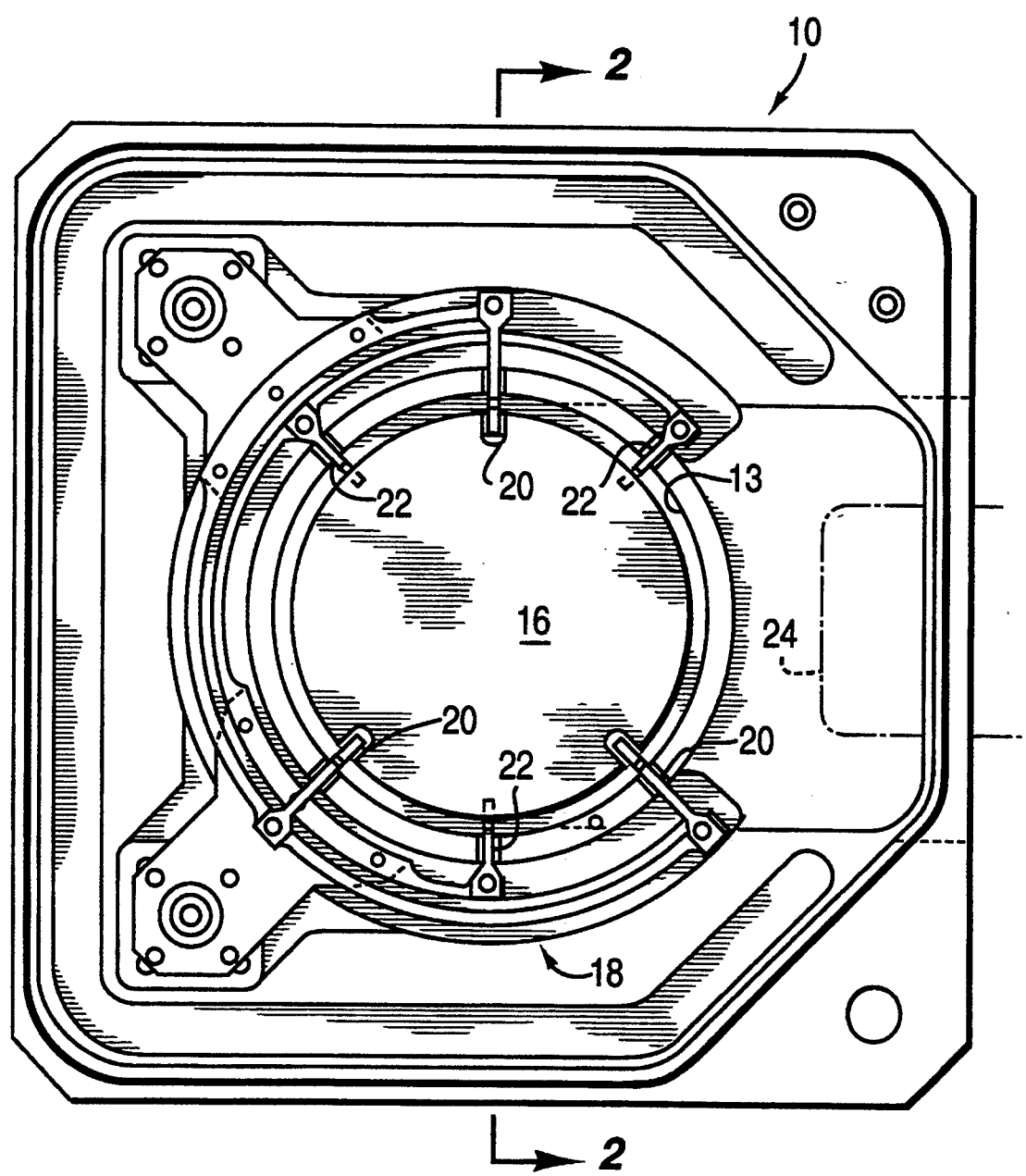
FIGS. 1 and 2 are a top plan view and a vertical cross sectional view respectively of a reactor suitable for carrying out the present process.

The silicon oxide layers deposited in accordance with the invention reduce or eliminate the surface sensitivity problem and the present process provides improved conformality and void-free gap filling capability to silicon oxide films, independent of the type of substrate on which the silicon oxide is deposited.

Surface sensitivity is manifested by a large decrease in deposition rate when TEOS silicon oxide is deposited onto silicon oxide as compared to silicon, particularly for a process utilizing a high ratio of ozone to TEOS, and degradation of film quality which is related to wet etch rate, moisture resistance and stress drift with time of the deposited films.

Although the exact reason for the surface sensitivity of silicon oxide films deposited on silicon oxide is not known, applicants believe it is due to the presence of Si-OH species on hydrophilic surfaces, such as thermally grown silicon oxide. Since TEOS molecules are hydrophobic, the TEOS molecules are repelled by such hydrophilic surfaces, and the absorption rate of TEOS by the surface is reduced, with a consequent reduction in the deposition rate. Since silicon itself is hydrophobic, this would explain the higher deposition rate of TEOS silicon oxide onto silicon as opposed to the deposition rate onto silicon oxide. Thus applicants believe this surface sensitivity problem is eliminated according to the present invention by passivation of hydrophilic surfaces containing Si-OH groups. This passivation is accomplished by substituting nitrogen atoms into the first layer of deposited TEOS silicon oxide films, which prevents hydrogen bonding to the surface of water or -OH radicals.

Nitrogen atoms can be introduced into the PECVD TEOS silicon oxide underlayers in several ways; for example, nitrogen gas can be added to the standard PECVD TEOS-oxygen process; ammonia ($NH_3$) gas can also be added, either alone or in combination with nitrogen; various oxides of nitrogen including one or more of nitrous oxide ($N_2O$), nitric oxide (NO) or nitrogen dioxide ($NO_2$) can be added to the standard TEOS/oxygen process; alternatively, nitrogen, a combination of nitrogen and ammonia, or a combination of one or more nitrogen oxides and ammonia can be added to the reaction in place of part of the free oxygen; or a combination of nitrogen, ammonia and a nitrogen oxide can replace the oxygen in the standard process.

A second layer of silicon oxide is deposited over the nitrogen-containing silicon oxide seed layer by known CVD TEOS/ozone/oxygen processes. A conventional ozone generator is used to supply a mixture of about 5–13% by weight of ozone in oxygen. This process takes place at comparatively low temperatures of about 350°–450° C., which avoids damaging underlying metallization and devices already processed onto the substrate. The silicon oxide layer so obtained is highly conformal, and void-free planarizing layers have been deposited onto steps down to about 0.5 micron in size and aspect ratio of over 1.5:1 using our two layer process.

The nitrogen-containing films and the ozone TEOS oxides can be deposited in the same reactor, or deposition can take place sequentially in two separate reactors. If two separate reactors are employed, suitably a multichamber apparatus is employed that can deposit sequential layers in two deposition reactors interconnected so that the substrates remain in a vacuum environment. However, exposure of the nitrogen-containing seed layer film to ambient conditions does not affect the ability of the nitrogen-containing seed layers to passivate surface sensitive substrates and to eliminate the surface sensitivity problem.

Figure 2:
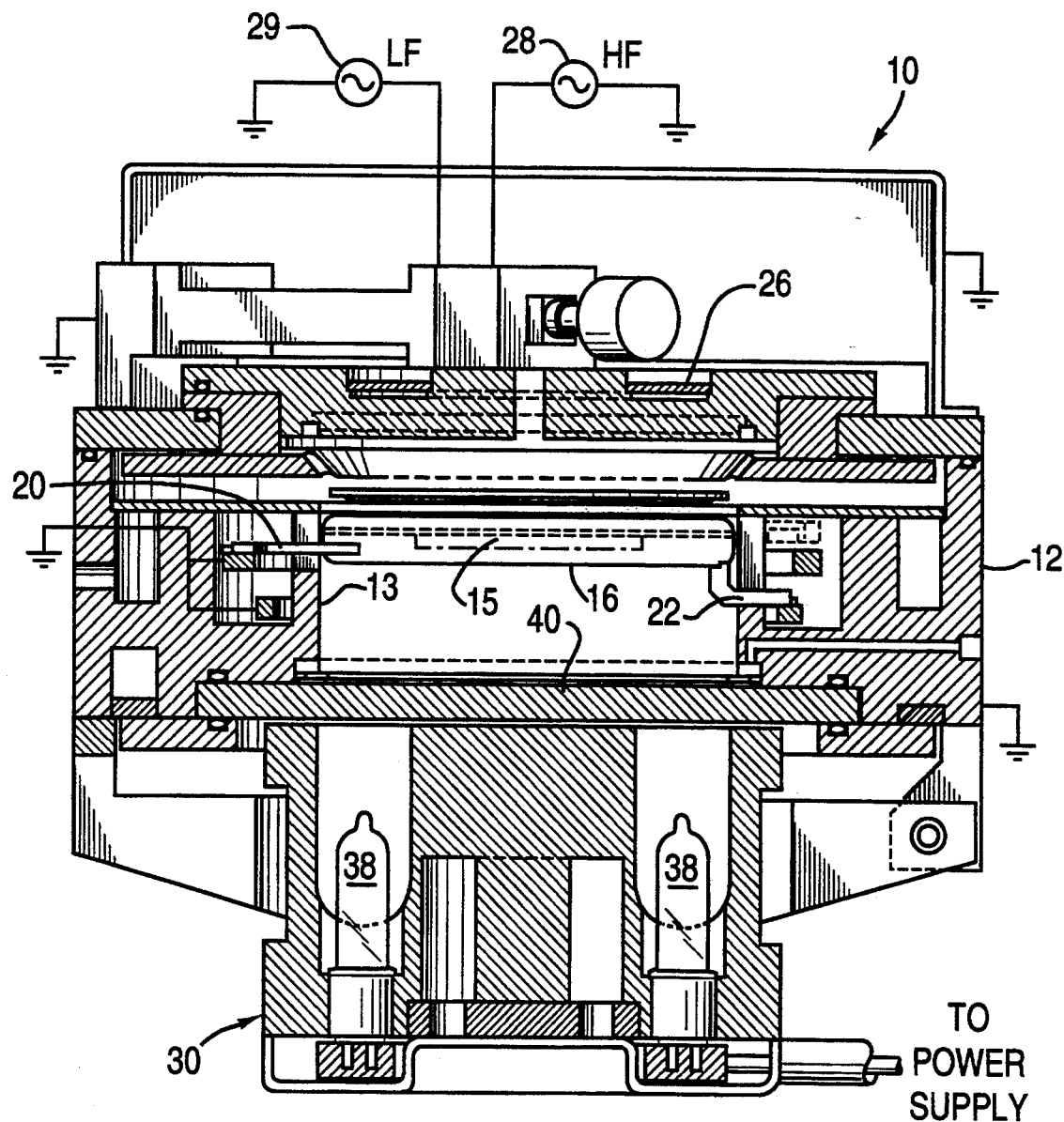

A suitable CVD/PECVD reactor in which the present process can be carried out is described in U.S. Pat. No. 4,872,947 to Chang et al assigned to Applied Materials, Inc, the assignee of the present invention. A top plan view and a vertical cross sectional view of a suitable reactor are shown in FIGS. 1 and 2.

A reactor system 10 comprises a vessel 12 that defines an inner vacuum chamber 13 that has a plasma processing region 14. The reactor system 10 also includes a susceptor 16 for holding the substrate and a substrate transport system 18 that includes vertically movable substrate support fingers 20 and susceptor support fingers 22. These fingers cooperate with an external robotic blade 24 for introducing substrates 15 into the chamber 13 and depositing the substrates 15 on the susceptor 16 for processing, and thereafter removing the substrates 15 from the susceptor 16 and the chamber 13. The reactor system 10 further comprises a process/purge gas manifold 26 that applies process gas and purging gas to the chamber 13; a high frequency RF power supply and matching network 28, and a low frequency RF power supply and matching network 29 for creating and sustaining a process gas plasma from the inlet gas; and a lamp heating system 30 for heating the susceptor 16 and substrate 15 positioned on the susceptor 16 to effect deposition onto the substrate 15. High frequency RF power (13.56 MHz) can be employed, or lower RF frequencies (100–450 KHz) can also be used, or a mixture of high and low frequencies can be used to generate a plasma from the process gases.

A gas manifold 26 supplies process gases to the chamber 13. The gas manifold 26 distributes the process gases evenly radially outward across the substrate 15 to promote even deposition across the substrate 15, and can include a RF/gas feed-through device 36 that supplies process gas to the gas manifold 26 that is RF driven. This ensures a high degree of plasma confinement between the manifold 26 and the substrate 15, situate on the susceptor 16 which is grounded.

A radiant heating system comprises an array of vertically oriented quartz-tungsten-halogen lamps 38 outside the chamber 13 which provide radiant heat to the susceptor 16 and the substrate 15 through a quartz window 40 in the chamber 13. Further details of the PECVD reactor are given in U.S. Pat. No. 4,872,947. Deposition of silicon oxide films containing nitrogen can be deposited using standard high frequency RF power, or a mixed high/low frequency RF power can be used.

The thermal silicon oxide deposition can also be carried out in the same reactor by changing reaction conditions and turning off the RF power to the manifold, or this second deposition step can be carried out in a separate conventional CVD reactor. The two reactors can be part of a multichamber reactor in which a central load lock chamber communicates with two or more deposition reactors, carrying out sequential deposition steps without breaking vacuum. Such multichamber reactors are commercially available. However, if the first nitrogen-containing silicon oxide deposition step is carried out in a PECVD reactor, and the second thermal CVD silicon oxide is carried out in a separate reactor, exposure of the nitrogen-containing silicon oxide film to the ambient will not adversely affect the thermal silicon oxide deposition, and the improved properties and conformality of the second silicon oxide layer are not adversely affected.

The invention will be further illustrated by the following examples, but the invention is not meant to be limited to the details described therein. In the examples, percent is by weight.

EXAMPLE 1

This example illustrates the differences in silicon oxide deposition rate with varying deposition surfaces and with the frequency of the RF source of the plasma in the deposition chamber.

Several deposition runs were made under varying deposition conditions in a PECVD reactor using 200 mm substrates. The single frequency process and a mixed frequency process were carried out under the following conditions, which can be scaled down for smaller substrate size:

|  | Single Frequency Process | Mixed Frequency Process |
| --- | --- | --- |
| Temperature | 350–450° C. | 350–450° |
| Pressure | 5–15 Torr | 2–15 Torr |
| Electrode Spacing | 200–600 mils | 200–600 mils |
| 13.56 MHz RF | 300–1000W | 0–1000W |
| Low Frequency RF | 0 | 0–500W |
| He/TEOS flow | 400–1000 sccm | 200–1000 sccm |
| O₂ flow | 200–3000 sccm | 200–1000 sccm |
| N₂O flow | 0–3000 sccm | 0–3000 sccm |
| N₂ flow | 0–3000 sccm | 0–3000 sccm |
| NH₃ flow | 0–500 sccm | 0–500 sccm |
| NO | 0–3000 sccm | 0–3000 sccm |
| NO₂ | 0–3000 sccm | 0–3000 sccm |

The first nitrogen-containing silicon oxide layers deposited as above were covered with a thermal CVD silicon oxide layer using a standard TEOS/ozone/oxygen process under the following conditions:

| Temperature | 350–450° C. |
| --- | --- |
| Pressure | 500 Torr-atmospheric pressure |
| Spacing between gas manifold and substrate | 200–300 mils |
| He/TEOS flow | 1000–5000 sccm |
| Ozone flow | 1000–6000 sccm |
| Ozone concentration | 5–13% (in O₂) |

The following Table I shows deposition rate loss of a high deposition rate process (low ozone:TEOS ratio) on various substrates. Substrate A is silicon; Substrate B is PECVD TEOS silicon oxide deposited at a single frequency RF source at 13.56 MHz at a deposition rate of 7000 angstroms/minute with and without nitrogen as indicated; Substrate C is PECVD TEOS silicon oxide deposited at a mixed frequency of 13.56 MHz and 100–450 KHz frequency at a deposition rate of 5000 angstroms/minute, with and without nitrogen as indicated. The wet etch rate of the combined silicon oxide deposited film was also measured.

TABLE I

| Substrate | Deposition Rate Loss, standard, % | Wet Etch Rate | Deposition Rate Loss, N-added, % | Wet Etch Rate |
|---|---|---|---|---|
| A | 0 | 5.6 | | |
| B | 5 | 5.6 | 1.8 | 5.6 |
| C | 5 | 5.7 | 3.5 | 5.6 |

The above process was repeated except at a higher ratio of ozone to TEOS, leading to a lower deposition rate of 1800 angstroms/minute.

TABLE 2

| Substrate | Deposition Rate Loss, standard, % | Wet Etch Rate | Deposition Rate Loss, N-added, % | Wet Etch Rate |
|---|---|---|---|---|
| A | 0 | 4.7 | | |
| B | 18 | 7.2 | 6 | 4.7 |
| C | 18 | 7.2 | 9 | 4.7 |

It is apparent that the addition of nitrogen to the PECVD silicon oxide seed layer generally lowers the reduction in deposition rate which is particularly effective when high ozone:TEOS ratios are used. The wet etch rate for silicon oxide when the underlying layer contains nitrogen in accordance with the invention is the same as that for silicon substrates.

The above runs were repeated varying the thickness of the nitrogen-containing layer. The results are summarized below in Tables 3 and 4 wherein the deposition conditions of Table 3 correspond to Table 1 and the deposition conditions of Table 4 correspond to Table 2.

TABLE 3

| Substrate | Thickness, Angstroms | Deposition Rate Loss, standard, % | Deposition Rate Loss, N-added, % |
|---|---|---|---|
| A | 1000 | 0 | |
| A | 3000 | 0 | |
| B | 1000 | 5 | 1.8 |
| B | 3000 | 5 | 1.0 |
| C | 1000 | 5 | 3.5 |
| C | 3000 | 5 | 3.0 |

TABLE 4

| Substrate | Thickness, Angstroms | Deposition Rate Loss, standard, % | Deposition Rate Loss, N-added, % |
|---|---|---|---|
| A | 1000 | 0 | |
| A | 3000 | 0 | |
| B | 1000 | 18 | 6 |
| B | 3000 | 18 | 2 |
| C | 1000 | 18 | 9 |
| C | 3000 | 17 | 6 |

It is apparent that the thickness of the nitrogen-containing layer has comparatively little effect on the deposition rate loss, particularly for a low deposition rate process.

The above processing using nitrogen-containing gases resulted in TEOS silicon oxide films with excellent film properties including stable stress, 3E9 dynes/$cm^2$ tensile to 3E9 dynes/$cm^2$ compressive. The refractive index ranged from 1.44–1.70. The thickness uniformity of the films over an 8 inch wafer had less than a 10% variation over the mean thickness.

We claim:

1. A method of depositing a dielectric planarizing layer over metal lines over a silicon oxide layer on a silicon wafer comprising:
   a) depositing a first silicon oxide layer on said wafer by generating a plasma from tetraethoxysilane and a nitrogen-containing gas, and
   b) depositing a second silicon oxide layer on said first silicon oxide layer by thermal chemical vapor deposition of tetraethoxysilane, ozone and oxygen.

2. A method according to claim 1 wherein said metal lines are 1 micron in width or less.

3. A method according to claim 1 wherein both process steps are carried out at a temperature below about 500° C.

4. A method according to claim 1 wherein both process steps are carried out at a temperature of from about 350–450° C.

5. A method according to claim 1 wherein both process steps are carried out in the same reactor.

6. A method according to claim 1 wherein the first process step is carried out in a PECVD reactor and the second process step is carried out in a thermal CVD reactor.

* * * * *